United States Patent
Mair et al.

(10) Patent No.: US 10,126,365 B2
(45) Date of Patent: Nov. 13, 2018

(54) METHOD AND APPARATUS FOR MONITORING AT LEAST ONE ELECTRONIC SWITCHING CONTACT FOR A VEHICLE

(71) Applicant: KNORR-BREMSE GESELLSCHAFT MIT BESCHRÄNKTER HAFTUNG, Mödling (AT)

(72) Inventors: Andreas Mair, Oberschlierbach (AT); Günther Bernecker, Buchkirchen (AT)

(73) Assignee: KNORR-BREMSE GESELLSCHAFT MIT BESCHRÄNKTER HAFTUNG, Mödling (AT)

( * ) Notice: Subject to any disclaimer, the term of this patent is extended or adjusted under 35 U.S.C. 154(b) by 74 days.

(21) Appl. No.: 15/026,935

(22) PCT Filed: Oct. 1, 2014

(86) PCT No.: PCT/EP2014/071023
§ 371 (c)(1),
(2) Date: Apr. 1, 2016

(87) PCT Pub. No.: WO2015/049276
PCT Pub. Date: Apr. 9, 2015

(65) Prior Publication Data
US 2016/0259007 A1 Sep. 8, 2016

(30) Foreign Application Priority Data

Oct. 2, 2013 (DE) ........................ 10 2013 110 993

(51) Int. Cl.
*G01R 31/02* (2006.01)
*G01R 31/327* (2006.01)
(Continued)

(52) U.S. Cl.
CPC ....... *G01R 31/3274* (2013.01); *G01R 27/205* (2013.01); *H01H 9/167* (2013.01);
(Continued)

(58) Field of Classification Search
CPC ......... B60R 1/00; B60R 2225/00; G01L 1/00; G01L 7/00
See application file for complete search history.

(56) References Cited

U.S. PATENT DOCUMENTS

| 4,981,084 A | 1/1991 | Templeton |
| 5,119,739 A | 6/1992 | Templeton et al. |

(Continued)

FOREIGN PATENT DOCUMENTS

| CN | 101889323 A | 11/2010 |
| DE | 102011003279 A1 | 8/2011 |

(Continued)

OTHER PUBLICATIONS

German Examination report dated Jul. 14, 2014.
(Continued)

*Primary Examiner* — Temilade Rhodes-Vivour
(74) *Attorney, Agent, or Firm* — Barnes & Thornburg LLP

(57) ABSTRACT

The present invention relates to a method for monitoring at least one electronic switching contact for a door system for a vehicle, wherein the switching contact has a first connection for a first electrical line and a second connection for a second electrical line. The method comprises a step of reading a first signal from a first monitoring point connected to the first connection in order to obtain a first monitoring signal, a step of reading a second signal from a second monitoring point connected to the second connection in order to obtain a second monitoring signal, and a step of combining the first monitoring signal and the second moni- (Continued)

toring signal in order to determine at least one state of the at least one switching contact.

9 Claims, 3 Drawing Sheets

(51) Int. Cl.
*H01H 9/16* (2006.01)
*G01R 27/20* (2006.01)
*G01L 7/00* (2006.01)
*B60R 1/00* (2006.01)

(52) U.S. Cl.
CPC ............. *B60R 1/00* (2013.01); *B60R 2225/00* (2013.01); *E05Y 2400/354* (2013.01); *E05Y 2400/51* (2013.01); *E05Y 2900/531* (2013.01); *G01L 7/00* (2013.01)

(56) References Cited

U.S. PATENT DOCUMENTS

| | | | |
|---|---|---|---|
| 8,269,376 | B1 | 9/2012 | Elberbaum |
| 8,339,139 | B2 | 12/2012 | Barrenscheen et al. |
| 9,188,645 | B2 | 11/2015 | Barrenscheen et al. |
| 2002/0070608 | A1 | 6/2002 | Matsuki |
| 2008/0036578 | A1 | 2/2008 | Toyama |
| 2009/0273419 | A1* | 11/2009 | Mitlmeier ............... H01H 89/06 335/127 |
| 2011/0063109 | A1* | 3/2011 | Ostermoller ......... G08B 13/149 340/541 |
| 2011/0187376 | A1* | 8/2011 | Barrenscheen .... G01R 31/3272 324/416 |
| 2013/0241563 | A1* | 9/2013 | Heise ...................... B60T 7/042 324/415 |
| 2013/0257463 | A1* | 10/2013 | Peuser ................... G01R 27/02 324/705 |
| 2014/0028322 | A1* | 1/2014 | Tzivanopoulos .. G01R 31/3606 324/433 |
| 2014/0071578 | A1* | 3/2014 | Mirzaei ..................... B60L 7/08 361/196 |

FOREIGN PATENT DOCUMENTS

| | | |
|---|---|---|
| DE | 102011105112 A1 | 12/2012 |
| EP | 0681310 A1 | 11/1995 |
| EP | 1139361 A1 | 10/2001 |
| FR | 2807193 A1 | 10/2001 |
| JP | H09318690 A | 12/1997 |
| JP | 201191895 A | 5/2011 |
| RU | 2011153362 A | 7/2013 |
| RU | 2509019 C1 | 3/2014 |
| RU | 2557008 A | 11/2014 |

OTHER PUBLICATIONS

Search report for International Patent Application No. PCT/EP2014/071023; dated Dec. 18, 2014.
Russian Office Action for corresponding application 2016117248/07 dated Aug. 10, 2017.
CN First Office Action and Search Report dated May 16, 2017; with English Translation.

* cited by examiner

METHOD AND APPARATUS FOR MONITORING AT LEAST ONE ELECTRONIC SWITCHING CONTACT FOR A VEHICLE

PRIORITY CLAIM

This patent application is a U.S. National Phase of International Patent Application No. PCT/EP2014/071023, filed Oct. 1, 2014, which claims priority to German Patent Application No. 10 2013 110 993.4, filed Oct. 2, 2013, the disclosure of which are incorporated herein by reference in their entirety.

FIELD

Disclosed embodiments relate to a method and to an apparatus for monitoring at least one electronic switching contact, for example for a door system for a vehicle, and to a circuit for a system, comprising a multiplicity of elements, for example doors, for a vehicle.

SUMMARY

Technical utility of the disclosed embodiments provides an improved method and an improved apparatus for monitoring at least one electronic switching contact for a vehicle, and an improved circuit for a system, comprising a multiplicity of elements, for a vehicle.

This is achieved by a method and an apparatus for monitoring at least one electronic switching contact for a vehicle, and by a circuit for a system, comprising a multiplicity of elements, for a vehicle as disclosed herein.

BRIEF DESCRIPTION OF THE FIGURES

Disclosed embodiments are explained in more detail below with reference to the appended drawings, in which.

DETAILED DESCRIPTION

Figure 1:
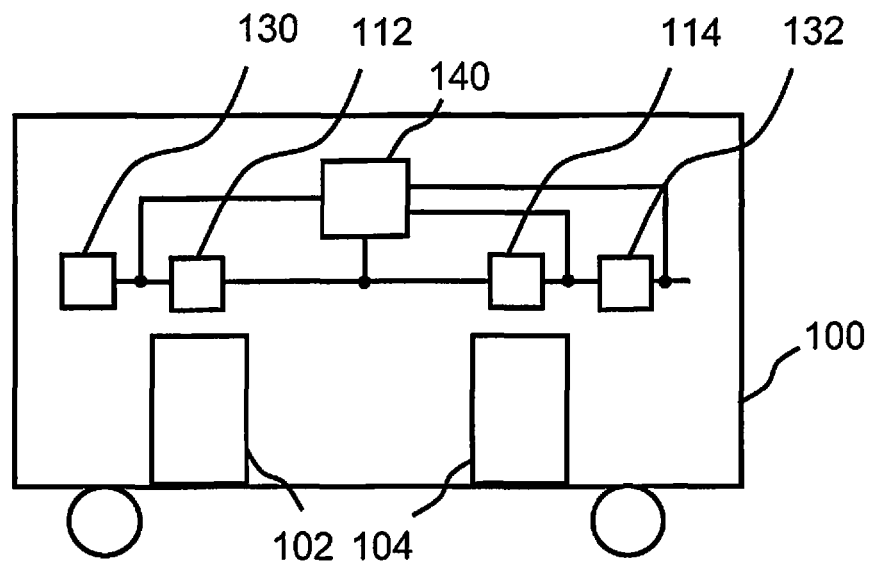
FIG. 1 shows a schematic illustration of a vehicle according to a disclosed embodiment.

A state monitoring system of an (electric) switch can be used to monitor at least the "switch closed" and "switch open" states or positions. In the case of a 4-pole, mechanically positively driven switch, in each case two poles can be assigned to one switching contact, and there is therefore a normally closed contact and a normally open contact or two normally closed contacts and two normally open contacts. The two switching contacts can be electrically isolated from one another but securely connected to one another using a mechanical connection. In this context, a switching contact can be integrated into the main circuit, and the second positively driven switching contact can serve as a monitoring contact of the main current contact. That is to say the second contact serves as a means of monitoring the first contact.

Technical utility of the disclosed embodiments provides an improved method and an improved apparatus for monitoring at least one electronic switching contact for a vehicle, and an improved circuit for a system, comprising a multiplicity of elements, for a vehicle. This is achieved by a method and an apparatus for monitoring at least one electronic switching contact for a vehicle, and by a circuit for a system that includes a multiplicity of elements, for a vehicle, as disclosed herein.

Electronically monitoring the state of switches makes it possible, for example, to monitor reliably a two-pole switch with respect to the through-connection or the interruption of an electrical line. Such a switch can be employed in an electrical circuit for any desired field of use, for example for a machine controller or system controller. For example, such a switch can be used to monitor a closed state of a door of a door system. Other fields of application may comprise, for example, a step or a stair step, a locking system, a brake unit or a locking unit of a vehicle.

In contrast to a 4-pole, positively driven switch whose mechanical coupling of its two contacts requires a minimum activation stroke, in the case of an electronic switch state monitoring system it is possible to dispense with such a minimum activation stroke. In addition, there is no limitation on the maximum activation speed. The most suitable switch variant can advantageously be employed using an electronic switch state monitoring system for any application. In particular, in contrast to a 4-pole, positively driven switch it is possible to dispense with a second contact, as a result of which a second (monitoring) contact is eliminated. By virtue of the fact that standard switches can be used, costs are reduced and installation space is optimized. In addition, smaller switching paths and a free selection of the activation speeds can be implemented. The electronic switch state monitoring system permits, for example, detection of cable breaks and switch contact monitoring as well as detection of wear on the contact.

A method for monitoring at least one electronic switching contact for a vehicle, wherein the switching contact has a first connection for a first electrical line and a second connection for a second electrical line, comprises the following operations: reading a first signal from a first monitoring point, connected to the first connection, to obtain a first monitoring signal; reading a second signal from a second monitoring point, connected to the second connection, to obtain a second monitoring signal; and combining the first monitoring signal and the second monitoring signal, to determine at least one state of the at least one switching contact.

An electronic switching contact can be understood to be a switch by which two electrical connection of the switching contact are either connected to one another in an electrically conductive fashion or electrically insulated from one another depending on the switched state of the switching contact. The switching contact can, therefore, be employed to interrupt a line in a controlled fashion. The state of the switching contact can be monitored by carrying out the operations of the method. The state can specify, for example, whether the switching contact is opened or closed, what resistance or impedance the switching contact has or which characteristic or signal form a signal which passes through the switching contact has.

Merely by way of example, the switching contact can be part of a door system of a vehicle. Such a vehicle may be, for example, a rail vehicle. The switching contact can be arranged in what is referred to as a dead man's switch, by which a closed state of the doors of the vehicle can be monitored.

The first and second monitoring points can be arranged on opposite sides of the switching contact. A monitoring point can be understood to be an electrical contact or a coupling apparatus. The monitoring point can be arranged, for example, directly at a connection of the switching contact or in the course of a line connected to the connection. A signal can be understood to be an electrical current or an electrical voltage. The signal can be a direct current on which an interference signal is superimposed. The signal can be tapped by the monitoring point. A corresponding monitoring signal can correspond to the read signal or can represent the read signal. For example, the monitoring signal can comprise a value sequence which can be determined by sampling the signal. If the monitoring point is embodied as a coupling apparatus which permits electrical isolation, the monitoring signal can be tapped free of potential from the connections of the switching contact or from lines connected to the connections of the switching contact.

The combination of the monitoring signals can be carried out by using a suitable combination rule. For example, the two monitoring signals can be compared with one another using the combination. The state can be determined by evaluating a result of the combination.

For example, in the combining operation, the first monitoring signal and the second monitoring signal can be examined for similarity, to determine the at least one state of the at least one switching contact. At least two degrees of similarity can be defined. Depending on whether the examination for similarity reveals that the first or the second degree of similarity is present, either a first or a second state of the switching contact can be determined. For example, a closed state of the switching contact can be determined if a high degree of similarity is present, and an open state of the switching contact can be determined if a low degree of similarity is present. In this way, a relevant state of the switching contact can be reliably determined.

According to one embodiment, in the combining operation the first monitoring signal and the second monitoring signal can be correlated with one another, to determine the at least one state of the at least one switching contact. By means of a correlation, monitoring signals with a chronologically variable signal form can also be compared. It is thus possible, for example, to use, for the determination of the state, high-frequency interference signals which are represented in the monitoring signals. Such interference signals are typically always present owing to electromagnetic fields in the surroundings of the switching contact.

In the operation of reading the first signal, the first signal can be read by a first contact of the first monitoring point. In this context, a second contact of the first monitoring point can be connected to the first connection, and the first and the second contacts of the first monitoring point can be electrically isolated from one another. In the operation of reading the second signal, the second signal can be read by a first contact of the second monitoring point. In this context, a second contact of the second monitoring point can be connected to the second connection, and the first and second contacts of the second monitoring point can be electrically isolated from one another. Such a monitoring point may be embodied, for example, as a capacitor. In this way, it is possible to monitor a switching contact which is located in a loop which is electrically disconnected from the surroundings, for example a dead man's switch.

According to one embodiment, the method can comprise a operation of applying a diagnostic signal to the first connection and/or the second connection as a function of the at least one state of the switching contact which is determined in the combining operation. In this context, the operations of reading and combining can be carried out again in response to the applying operation. For example, an alternating voltage can be applied to the switching contact using the diagnostic signal. The diagnostic signal can have a signal form which differs from signal forms which are typically applied to the switching contact. The diagnostic signal can be used to determine the state again or to determine a further state of the switching contact.

The method as claimed in one of the preceding claims, in which in the combining operation a switched state of the at least one switching contact is determined as the at least one state. For example, in this way it is possible to differentiate between an open state and a closed state of the switching contact.

Correspondingly, in the combining operation an electrical resistance of the switching contact and additionally or alternatively an impedance of the switching contact can be determined as the at least one state. As a result, for example a state of wear of the switching contact can be determined. Correspondingly, an electrical resistance between an electrical potential of the switching contact and a further electrical potential can be determined as the state. As a result, for example a leakage current can be detected.

Correspondingly, in the combining operation a characteristic of an interference signal which is applied to the first connection or the second connection can be determined as the at least one state. In this way, for example the presence of an interference field can be detected.

According to one embodiment, the method can comprise an operation of reading a third signal from a third monitoring point. The third monitoring point can be connected to a connection for a further switching contact which is connected in series with the switching contact, to obtain a third monitoring signal. In this context, in the combining operation the third monitoring signal and either the first monitoring signal or the second monitoring signal or a further monitoring signal can be combined, to determine at least one state of the further switching contact. The further monitoring signal can be used if two monitoring points are arranged in a connecting line between the two switching contacts. Correspondingly, further switching contacts can be monitored by using further monitoring signals.

An apparatus for monitoring at least one electronic switching contact for a vehicle, wherein the switching contact has a first connection for a first electrical line, and a second connection for a second electrical line, has the following features: a first reading device for reading a first signal from a first monitoring point, connected to the first connection, to obtain a first monitoring signal; a second reading device for reading a second signal from a second monitoring point, connected to the second connection, to obtain a second monitoring signal; and a combining device for combining the first monitoring signal and the second monitoring signal, to determine at least one state of the switching contact.

An apparatus can be understood to be an electrical appliance or an electrical circuit, for example an integrated circuit. The apparatus may be designed to receive and output signals via suitable interfaces.

A circuit for a system, comprising a multiplicity of elements, for a vehicle has the following features: a series circuit composed of a multiplicity of electronic switching contacts, wherein in each case one switching contact is assigned to one of the elements, and each of the switching contacts has a coupling interface to an element assigned to the switching contact, to represent a closed state of the assigned element using a switched state of the switching contact; a multiplicity of monitoring points which are arranged in the series circuit, wherein each connection of the switching contacts is assigned a monitoring point; and an apparatus for monitoring the multiplicity of switching contacts, wherein the apparatus has a number of reading devices which corresponds to the multiplicity of monitoring points, said reading devices being each connected to one of the monitoring points and designed to each read a signal from one of the monitoring points, to obtain one monitoring signal per monitoring point, and wherein the apparatus has a combining device which is designed to combine the monitoring signals, to determine at least one state of each one of the switching contacts.

The switching contacts may be, for example, part of what is referred to as a dead-man's switch. The switching contacts can be checked, for example, for faults using the monitoring apparatus. The system can be an entry system, for example a door system, a step system or a locking unit, or a drive system, for example a brake system, of the vehicle. Correspondingly, an element can be, for example, a door, a step, a locking mechanism or a brake unit.

According to one embodiment, a first end of the series circuit can be embodied as an interface to a power supply. The series circuit can have an electromagnetic switch at a second end opposite the first end. The circuit can have at least one further monitoring point, which is assigned to at least one connection of the electromagnetic switch and can have at least one further reading device which is connected to the at least one further monitoring point and which is designed to read a signal from the at least one further monitoring point, to obtain at least one further monitoring signal. The combining device can be designed to determine a capacitive or inductive behavior of the electromagnetic switch arranged in the series circuit by using the further monitoring signal as at least one state of the electromagnetic switch. The electromagnetic switch may be, for example, a contactor. The state may indicate, for example, that the electromagnetic switch has a defect. Alternatively, the state can indicate, for example, that the electromagnetic switch is ready for use.

With this understanding of the disclosed embodiments in mind, reference is not made to the figures which illustrate disclosed embodiments, wherein identical or similar reference symbols are used for the elements which are illustrated in the various drawings and which act similarly, wherein a repeated description of these elements is omitted.

FIG. 1 shows a schematic illustration of a vehicle 100 according to a disclosed embodiment. The vehicle 100 may be, for example, a rail vehicle. The vehicle 100 has two doors 102, 104. Each door 102, 104 is assigned a separate switching contact 112, 114, also referred to as switches. The first switching contact 112 is assigned to the first door 102, and the second switching contact 104 to the second door 104. The first switching contact 112 is mechanically coupled to the first door 102. If the first door 102 is opened, or not completely closed, the first switching contact 112 is open. This can also be correspondingly inverted in the case of the first switching contact 112 and the further switching contacts 114. If the first door 102 is closed, the first switching contact 112 is closed. The second switching contact 114 is mechanically coupled to the second door 104. If the second door 104 is opened, or not completely closed, the second switching contact 114 is open. If the second door 104 is closed, the second switching contact 114 is closed. In a closed state of the switching contacts 112, 114, a flow of current through the switching contacts 112, 114 is possible.

The switching contacts 112, 114 may be connected in a series circuit. At one end of the series circuit, a signal is fed into the series circuit via a power supply 130, for example in the form of a voltage source. The signal may be for example, a direct current which flows through the switching contacts 112, 114 when the switching contacts 112, 114 are all closed. If one of the switching contacts 112, 114 is open, the flow of current through the series circuit is interrupted. On the basis of the flow of current it is therefore possible to detect that all the doors 102, 104 are closed or that at least one of the doors 102, 104 is opened.

An apparatus 140 for monitoring the switching contacts 112, 114 is connected via switching lines to the connections of the switching contacts 112, 114, and according to one disclosed embodiment to the connections of the contactor 132. The apparatus 140 is designed to monitor states of the switching contacts 112, 114, and according to a disclosed embodiment, of the contactor 132.

The disclosed embodiment of a door system is provided by way of example. Instead of doors 102, 104, other elements of the vehicle 100 can also be monitored using the switching contacts 112, 114. The switching contacts 112, 114 can be arranged in what is referred to as a dead man's switch.

Figure 2:
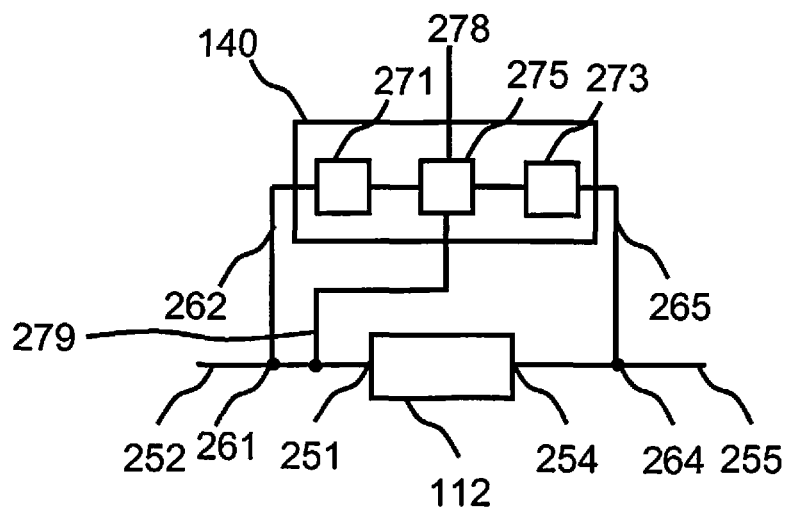
FIG. 2 shows a schematic illustration of an apparatus for monitoring a switching contact according to a disclosed embodiment.

FIG. 2 shows a schematic illustration of an apparatus 140 for monitoring a switching contact 112 according to a disclosed embodiment. This may be the apparatus shown in FIG. 1. The switching contact 112 may be one of the switching contacts which are shown in FIG. 1.

The switching contact 112 has a first connection 251 which is connected to a first line 252. In addition, the switching contact 112 has a second connection 254 which is connected to a second line 255. On the side of the first connection 251, for example at the first connection 251 or on the first line 252, a first monitoring point 261 is arranged which is connected to the apparatus 140 via a first monitoring line 262. On the side of the second connection 254, for example at the second connection 254 or at the second line 255, a second monitoring point 264 is arranged which is connected to the apparatus 140 via a second monitoring line 265.

The apparatus 140 has a first reading device 271, a second reading device 273 and a combining device 275. The first reading device 271 is designed to read, via the first monitoring line 262 and the first monitoring point 261, a signal which is applied to the first connection 251 or the first line 252, and to output the said signal as a first monitoring signal to the combining device 275. The second reading device 273 is designed to read, via the second monitoring line 265 and the second monitoring point 264, a signal which is applied to the second connection 254 or the second line 255 and to output said signal as a second monitoring signal to the combining device 275. The combining device 275 is designed to combine the first monitoring signal and the second monitoring signal with one another, for example to compare or to correlate them with one another to determine at least one state of the switching contact 112. For example, the combining device 275 can be designed to combine the two monitoring signals, to determine a similarity value which represents a similarity between the monitoring signals. If a high degree of similarity is present, the state of the switching contact 112 may be determined, for example, as being closed. If a low degree of similarity is present, the state of the switching contact 112 may be determined, for example, as being opened. The presence of a high or low degree of similarity can be determined, for example, by a comparison of the similarity value with a threshold value. The combining device 275 can also be designed to use one or both of the monitoring signals to carry out an impedance measurement, with the result that an impedance of the switching contact 112 can be determined, or to carry out a resistance measurement, with the result that a resistance of the switching contact 112 can be determined.

According to one disclosed embodiment, the apparatus 140 is designed to output a state signal which represents the state which is determined for the switching contact 112. The state signal can be processed, for example, by a central control apparatus, for example of a vehicle.

According to one disclosed embodiment, the apparatus 140 is designed to feed a diagnostic signal 279 into one of the connections 251, 254 or into one of the lines 252, 255. For example, the apparatus 140 can be designed to feed the diagnostic signal 279 into one of the monitoring points 261, 264. The diagnostic signal 279 can be fed via one of the monitoring lines 262, 265 or via an additional diagnostic line. The diagnostic signal 279 can be a constant signal, for example a direct voltage, or an alternating signal with a characteristic signal form that changes over time. After or during the feeding-in of the diagnostic signal 279, the apparatus 140 can be designed to read a monitoring signal via at least one of the reading devices 271, 273 and to compare the two read monitoring signals with one another or to compare one of the monitoring signals with the diagnostic signal 279 in the combining device 275. By using the fed-in diagnostic signal 279, one of the states of the switching contact 112 which has already been determined can be checked or a further state can be detected.

In a corresponding form, the apparatus 140 can be used to monitor a multiplicity of switching contacts, as is shown, for example, below in FIG. 4. In this context, each switching contact can be arranged between two monitoring points, or two or more switching contacts can also be arranged between two adjacent monitoring points. It is also possible to arrange just one monitoring point between two adjacent switching contacts, wherein the signal which is read via this monitoring point can be used to monitor the two adjoining switching contacts.

The lines 252, 255 and the switching contact 112 can be electrically decoupled from the monitoring lines 262, 265 and from a line for conducting the diagnostic signal 279. This can be achieved, for example, by virtue of the fact that the monitoring signals are decoupled from the lines 252, 255 using capacitors arranged at the monitoring points 261, 264. Correspondingly, the diagnostic signal 279 can be coupled into the line 252 via a further capacitor.

According to one disclosed embodiment, the lines 252, 255 and the switching contact 112 are part of a dead man's switch. In this context, there is an electric isolation between the dead man's switch and an evaluation which can be carried out, for example, in the apparatus 140. As a result, the potentials of the evaluation and the dead man's switch are isolated from one another. There is therefore no ground connection. If the switching contact 112 or all of the other switching contacts 112 of the dead man's switch are also open, there is no ground connection. Nevertheless, the monitoring can be carried out by virtue of the fact that the alternating current resistance of a structure, here, for example, of the switching contact 112, is determined.

According to one disclosed embodiment, the dead man's switch or the signal of the dead man's switch, typically a direct voltage signal, must not be influenced by "third parties". For this reason, very low signal powers are used, which are below the EMC approval, such as is explained below with reference to FIG. 6. The dead man's switch is kept electrically isolated from all the other signals. This is achieved, for example, using a capacitor. The alternating voltage signal in the form of the diagnostic signal 279 is coupled into the dead man's switch via the capacitor or a further capacitor and is decoupled free of direct voltage again via a second capacitor. The problem of groundless detection—theoretically all the switches can be open or some open and some closed—is that unknown potential influences are present. On the basis thereof, the diagnostic signal 279 is selected in such a way that the alternating voltage resistance of the cable, for example between the one supply point of the diagnostic signal 279 and the monitoring point 264, is sufficient to generate a necessary signal amplitude for the evaluation circuit 140. The basic idea of this approach is to measure an alternating current resistance of an unknown structure and to derive possible errors therefrom with suitable methods. The diagnostic signal, in particular a frequency of the diagnostic signal, can be selected suitably in accordance with the inductive and capacitive behavior of the structure. For example, in the case of a very low inductance or capacitance of the structure, a diagnostic signal with a high frequency can be selected. In conventional methods, direct voltage signals are used as a diagnostic signal or there may be no electric isolation present. The system is limited here not only to drives but can very generally also be employed for, for example, stair steps, brake units or locking units or locking systems.

Figure 3:
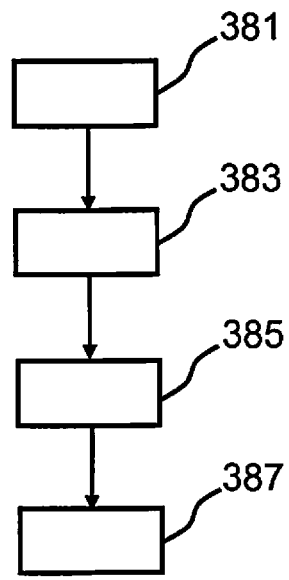
FIG. 3 shows a flowchart of a method for monitoring a switching contact according to a disclosed embodiment.

FIG. 3 shows a flowchart of a method for monitoring a switching contact according to a disclosed embodiment. The method can be implemented, for example, by apparatuses of the apparatus shown in FIG. 2.

In an operation at 381, a first signal is read by a first monitoring point which is connected to a first connection of the switching contact. On the basis of the first signal, a first monitoring signal is generated, for example by sampling the first signal.

In an operation at 383, a second signal is read by a second monitoring point which is connected to a second connection of the switching contact. On the basis of the second signal, a second monitoring signal is generated, for example by sampling the second signal.

In an operation at 385, the first monitoring signal and the second monitoring signal are combined. As a result, one or more states of the at least one switching contact which relate to different parameters of the switching contact are determined.

In an optional operation at 387, a diagnostic signal can be coupled as an actively generated interference signal into one of the connections or to a line which is connected to one of the connections. Subsequently, the operations at 381, 383, 385 can be carried out repeatedly.

Figure 4:
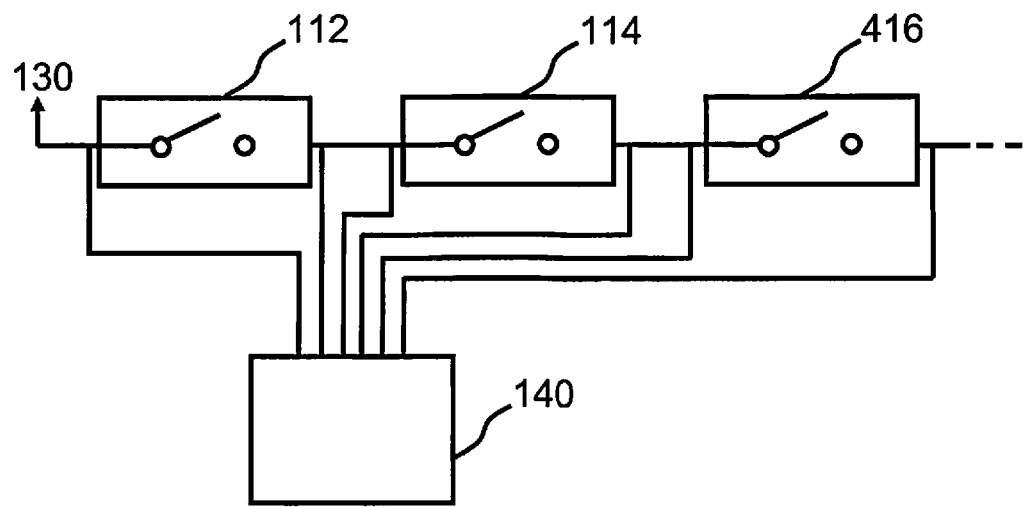
FIG. 4 shows a circuit for a door system, comprising a multiplicity of doors, according to a disclosed embodiment.

FIG. 4 shows a circuit for a door system comprising a multiplicity of doors, according to a disclosed embodiment. By way of example, three switching contacts 112, 114, 416 and an apparatus 140 for monitoring the switching contacts 112, 114, 416, as has already been described with reference to the preceding figures, are shown.

The switching contacts 112, 114, 416 are connected in series. A first connection of the first switching contact 112 is connected to a power supply 130, for example a 144V direct voltage source. A second connection of the first switching contact 112 is connected to a first connection of the first switching contact 114. A second connection of the second switching contact 114 is connected to a first connection of the third switching contact 416.

The arrangement composed of switching contacts 112, 114, 416 and power supply 130 can be referred to as what is referred to as a dead man's switch whereby the closed state of vehicle doors can be monitored. A switching signal for a control apparatus, for example what is referred to as an MDCU unit, can be generated using the power supply 130 and the switching contacts 112, 114, 416.

The apparatus 140 is connected via a first monitoring line to the first connection of the first switching contact 112, via a second monitoring line to the second connection of the second switching contact 112, via a third monitoring line to the first connection of the second switching contact 114, via a fourth monitoring line to the second connection of the second switching contact 114, via a fifth monitoring line to the first connection of the third switching contact 416, and via a sixth monitoring line to the second connection of the third switching contact 416. At least one of the monitoring lines can be designed to feed a diagnostic signal from the apparatus 140 into one of the connections of the switching contacts 112, 114, 416. Alternatively, at least one additional line can be provided for conducting at least one diagnostic signal.

The second connection of the third switching contact 416 can be connected, for example, to a first connection of a further switching contact, to a connection of a safe contactor or to a connection of an evaluation device which is designed to detect, for example using current measurement or voltage measurement, whether there is a continuous connection to the power supply 130, based on which it can be inferred that all the switching contacts 112, 114, 416 are closed.

In the electrical lines connected to the connections of the switching contacts 112, 114, 416, interference signals can occur, for example, owing to interference fields. The interference signals can be detected using the monitoring lines and employed to monitor the switching contacts 112, 114, 416. For this purpose, interference signals which are detected, for example, using two different monitoring lines, or monitoring signals derived therefrom, can be evaluated in terms of their form, their chronological offset or their chronological offset between the current and the voltage.

As a result, an electronic switch state monitoring system or an electronic switching contact monitoring system can be implemented. What is referred to as the super-heterodyne principle of signal superimposition theory serves as a basis here. Use is made here of the fact that there is no interference-free DC signal that is conducted in this disclosed embodiment from the power supply 130 through the switching contacts 112, 114, 416, and that each DC signal also has interferences superimposed on it (AC signal).

Electromagnetic fields, mobile radio beams, for example of the GSM standard, switching processes or general noise, as considered, for example, within the scope of electromagnetic compatibility (EMC), can serve as interference sources.

It can be assumed that the interference (considered quite generally) remains constant over the structure to be considered. This means that on condition that the switch is closed, the interferences at the input of the switch are also present at the output of the switch.

To increase the detection probability of the switch position of the switching contacts 112, 114, 416, a second interference signal, also referred to as a diagnostic signal, can additionally be introduced actively into the system, which signal can also be measured in the case of the closed switch position of the switching contacts 112, 114, 416 both at the input and at the output, that is to say the two connections of one of the switching contacts 112, 114, 416 or a series circuit composed of a plurality of, or of all of, the switching contacts 112, 114, 416.

The apparatus can check the switching contacts 112, 114, 416, for example, for impedance and conductivity, or can determine values relating to the impedance and conductivity. According to one disclosed embodiment, the apparatus 140 is embodied as a digital signal controller. Independent analysis for impedance and conductivity of a conductor loop is therefore possible using a digital signal controller.

According to one disclosed embodiment, the inputs of the apparatus 140 are sampled and compared for similarity. For this purpose, for example a cross-correlation or Fourier transformation can be carried out. If the similarity of the sampled signals is very high, from which it can be inferred that the switching contact 112, 114, 416, also referred to as a switch, being considered is closed, an attempt is made to bring about a difference by applying a digitally generated interference signal, also referred to as a diagnostic signal, to one or both lines which are connected to the connections of the switching contact 112, 114, 416 being considered. If the similarity of the sampled values of the sampled signals remains the same to a certain degree, the switching contact 112, 114, 416 being considered is unambiguously closed. In this case, the apparatus 140 can be designed to output a corresponding state signal which indicates the state of the switching contact 112, 114, 416 being considered.

According to one disclosed embodiment, the apparatus 140 can make available the following possible measurement results. On the one hand, the switched state at the switch 112, 114, 416 and the state of the lines between the switches 112, 114, 416 can be determined. In addition, the resistance of the switch 112, 114, 416 can be determined, for example, to detect the wear, or in the case of a plug connection, to find contact faults or cable breaks. In addition, leakage currents or contact resistances with respect to other electrical potentials can be determined, for example, by measuring the electrical isolation with respect, for example, to a vehicle bodywork. A complex indicator of a resistance can be determined as a measurement result. The complex indicator of the resistance can be used to detect whether the section between two relevant monitoring points of the signals is capacitive or inductive. This permits detection of whether a safety contactor at the end of the line is in order. In addition, an evaluation of the generally occurring interference fields in the loop which is conducted through the switching contacts 112, 114, 416 is possible.

Figure 5:
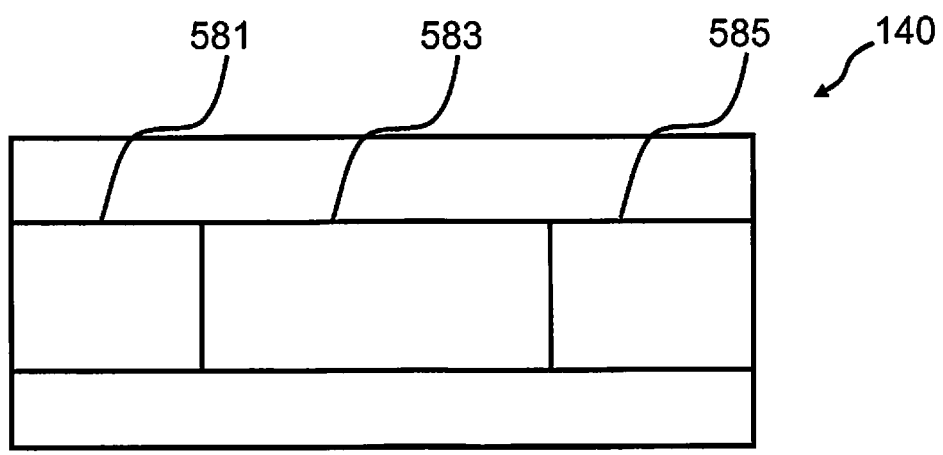
FIG. 5 shows a block diagram of an electronic switching contact monitoring system according to a disclosed embodiment.

FIG. 5 shows a block diagram of an apparatus 140 for monitoring at least one switching contact according to a disclosed embodiment. The apparatus 140 has on the input side an input filter 581, for example a bandpass, a microprocessor 583 for evaluating the signal differences and on the output side an output filter 585 for an active interference signal.

The input filter 581 is designed to subject signals read, for example, by suitable monitoring points at at least one switching contact to input filtering. The microprocessor 583 is designed to combine or compare the filtered signals. The output filter 585 is designed to subject a diagnostic signal, in the form of the active interference signal, provided for feeding into the at least one switching contact to output filtering.

Such an apparatus 140 can be implemented as a stand-alone variant, that is to say as an independent apparatus, or as a variant which is indicated completely into a further control apparatus.

Figure 6:
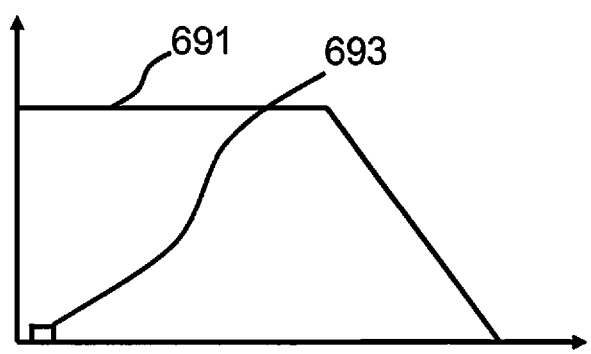
FIG. 6 shows an illustration of EMC approval limits according to a disclosed embodiment.

FIG. 6 shows an illustration of EMC approval limits according to a disclosed embodiment. A diagram in which the frequency in Hertz is plotted on the abscissa and the field strength in volts per meter is plotted on the ordinate is shown. A characteristic curve 691 which represents an EMC limit, below which the products thereof must be fully functionally capable, is indicated. In addition, a characteristic curve 693 is indicated which shows an EMC limit of the electronic switching contact monitoring system, which can be implemented, for example, by a described apparatus for monitoring at least one switching contact.

Full EMC capability as well as the irradiation and emission concerned are given using the EMC approval limits shown in FIG. 6. In addition, a minimum operating capacity and therefore a position below the EMC approval limits is given.

The described approach permits the use of standard switches in a monitoring loop, for example one referred to as a dead man's switch.

Such switches permit, when necessary, a small activation path of, for example, less than 4.9 mm, a high activation speed of, for example, over 1 m/s, a large activation force of, for example, over 3 N and a restoring force of, for example, less than 0.2 N.

As a result, failures of the switches owing to excessively high activation speeds can be avoided. Short activation paths can also be implemented, and a precise switch setting is not necessary. In addition, the space required can be kept smaller and the costs can be kept low. In addition, the specification of such a circuit can be kept simple, as a result of which new developments, for example the use of a magnetic brake, can be made inexpensive.

The described disclosed embodiments are selected only by way of example and can be combined with one another.

LIST OF REFERENCE NUMBERS

100 Vehicle
102 Door
104 Door
112 Switching contact
114 Switching contact
130 Power supply
132 Contactor
140 Monitoring device
251 First connection
252 First line
254 Second connection
256 Second line
261 First monitoring point
262 First monitoring line
264 Second monitoring point
265 Second monitoring line
271 Reading device
273 Reading device
275 Combining device
278 State signal
279 Diagnostic signal
416 Switching contact
581 Input filter
583 Microprocessor
585 Output filter
691 Characteristic curve
693 Characteristic curve

The invention claimed is:

1. A method for monitoring at least one electronic switching contact for a vehicle, wherein the switching contact has a first connection for a first electrical line and a second connection for a second electrical line the method comprising:
    reading a first signal from a first monitoring point, connected to the first connection of the switching contact to obtain a first monitoring signal;
    reading a second signal from a second monitoring point, connected to the second connection of the switching contact, to obtain a second monitoring signal; and
    combining the first monitoring signal and the second monitoring signal to determine at least one state of the at least one switching contact,
    wherein, in the reading the first signal, the first signal is read by a first contact of the first monitoring point, wherein a second contact of the first monitoring point is connected to the first connection, and the first and the second contacts of the first monitoring point are electrically isolated from one another, and
    wherein, in the reading the second signal, the second signal is read by a first contact of the second monitoring point, wherein a second contact of the second monitoring point is connected to the second connection, and the first and second contacts of the second monitoring point are electrically isolated from one another.

2. The method of claim 1, wherein, in the combining the first monitoring signal and the second monitoring signal are examined for similarity, to determine the at least one state of the at least one switching contact.

3. The method of claim 1, further comprising applying a diagnostic signal to the first connection and/or the second connection as a function of the at least one state of the switching contact determined in the combining, wherein the reading the first and second signals and combining are carried out again in response to the applying.

4. The method of claim 1, wherein, in the combining, a switched state of the at least one switching contact is determined as the at least one state.

5. The method of claim 1, wherein, in the combining, an electrical resistance of the switching contact and/or an impedance of the switching contact and/or an electrical resistance between an electrical potential of the switching contact and a further electrical potential are/is determined as the at least one state.

6. The method of claim 1, wherein, in the combining, a characteristic of an interference signal which is applied to the first connection or the second connection is determined as the at least one state.

7. The method of claim 1, further comprising reading a third signal from a third monitoring point, wherein the third monitoring point is connected to a connection for a further switching contact which is connected in series with the switching contact, to obtain a third monitoring signal, and wherein, in the combining, the third monitoring signal and either the first monitoring signal or the second monitoring signal or a further monitoring signal are combined to determine at least one state of the further switching contact.

8. An apparatus for monitoring at least one electronic switching contact-for a vehicle, wherein the switching contact has a first connection for a first electrical line and a second connection for a second electrical line, wherein the apparatus comprises:
    a first reading device for reading a first signal from a first monitoring point, connected to the first connection, to obtain a first monitoring signal;
    a second reading device for reading a second signal from a second monitoring point, connected to the second connection, to obtain a second monitoring signal; and a combining device for combining the first monitoring signal and the second monitoring signal, to determine at least one state of the switching contact, wherein, in the obtaining of the first signal, the first signal is read by a first contact of the first monitoring point, wherein a second contact of the first monitoring point is connected to the first connection, and the first and the second contacts of the first monitoring point are electrically isolated from one another, and wherein, in the reading the second signal, the second signal is read by a first contact of the second monitoring point, wherein a second contact of the second monitoring point is connected to the second connection, and the first and second contacts of the second monitoring point are electrically isolated from one another.

9. A circuit for a system, comprising a multiplicity of elements for a vehicle, the circuit comprising:

a series circuit composed of a multiplicity of electronic switching contacts, wherein in each case one switching contact is assigned to one of the elements, and each of the switching contacts has a coupling interface to an element, assigned to the switching contact, to represent a state of the assigned element using a switched state of the switching contact;

a multiplicity of monitoring points which are arranged in the series circuit, wherein each connection of the switching contacts is assigned a monitoring point; and an apparatus for monitoring the multiplicity of switching contacts, wherein the apparatus has a number of reading devices which corresponds to the multiplicity of monitoring points, the reading devices each being connected to one of the monitoring points and designed to each read a signal from one of the monitoring points, to obtain one monitoring signal per monitoring point, and wherein the apparatus has a combining device designed to combine the monitoring signals, to determine at least one state of each one of the switching contacts, wherein, a first end of the series circuit is an interface to a power supply, and the series circuit has an electromagnetic switch at a second end opposite the first end, and wherein the circuit has a further monitoring point, which is assigned to a connection of the electromagnetic switch, and a further reading device, which is connected to the further monitoring point and which is designed to read a signal from the further monitoring point to obtain a further monitoring signal, and wherein the combining device is designed to determine a capacitive or inductive behavior of the electromagnetic switch arranged in the series circuit by using the further monitoring signal as at least one state of the electromagnetic switch.

* * * * *